United States Patent
Poeltl et al.

(10) Patent No.: US 8,084,891 B2
(45) Date of Patent: Dec. 27, 2011

(54) METHOD AND APPARATUS FOR OPTIMIZING SYNCHRONOUS SWITCHING OPERATIONS IN POWER SYSTEMS

(75) Inventors: Anton Poeltl, Greensburg, PA (US); Michael Mendik, Jeanette, PA (US)

(73) Assignee: ABB Technology AG, Zurich (CH)

( * ) Notice: Subject to any disclaimer, the term of this patent is extended or adjusted under 35 U.S.C. 154(b) by 299 days.

(21) Appl. No.: 12/209,388

(22) Filed: Sep. 12, 2008

(65) Prior Publication Data
US 2009/0073627 A1    Mar. 19, 2009

Related U.S. Application Data

(60) Provisional application No. 60/972,263, filed on Sep. 14, 2007.

(51) Int. Cl.
*H01H 47/00* (2006.01)
*H01H 83/00* (2006.01)

(52) U.S. Cl. ...................................... 307/125
(58) Field of Classification Search .................. 307/125
See application file for complete search history.

(56) References Cited

U.S. PATENT DOCUMENTS

| | | |
|---|---|---|
| 5,629,869 A | 5/1997 | Johnson et al. |
| 5,636,134 A | 6/1997 | Johnson et al. |
| 5,638,296 A | 6/1997 | Johnson et al. |

*Primary Examiner* — Rexford Barnie
*Assistant Examiner* — Dru Parries
(74) *Attorney, Agent, or Firm* — Robert P. Nupp; Michael C. Prewitt

(57) ABSTRACT

A method and an apparatus for optimizing switching operations executed by a switching device coupled to an AC power line, wherein signals related to the waveform of the electrical phases of the power line are acquired. When a command for executing a switching operation on one of the electrical phases is issued, the signals acquired are stored. Based on the signals stored, data indicative of the severity of switching transients occurred during the executed switching operation and second data indicative of the time occurred for the executed switching operation are calculated and correlated to each other. Based on the data calculated, it is determined whether a parameter representative of a target point on the waveform for executing future switching operations substantially synchronous with the waveform has to be adjusted.

24 Claims, 4 Drawing Sheets

METHOD AND APPARATUS FOR OPTIMIZING SYNCHRONOUS SWITCHING OPERATIONS IN POWER SYSTEMS

CROSS REFERENCE TO RELATED APPLICATIONS

This application claims the priority of U.S. provisional patent application Ser. No. 60/972,263 filed on Sep. 14, 2007, entitled "Method and Apparatus for Optimizing Synchronous Switching Operations in Power Systems" the contents of which are relied upon and incorporated herein by reference in their entirety, and the benefit of priority under 35 U.S.C. 119(e) is hereby claimed.

BACKGROUND OF THE INVENTION

This invention relates in general to the field of synchronous switching operations in power lines. In particular, the present invention relates to a method and an apparatus for optimizing synchronous switching operations executed by a switching device operatively coupled to an AC power line.

As it is well known, power systems for transmitting and distributing electricity from power sources to various loads and users are equipped with several types of protecting switchgear, such as high-voltage circuit breakers. Such switchgear are typically adapted for intervening under determined operating conditions so as to ensure a proper functioning of an associated power line and of loads/users connected therewith.

Voltage and current transients generated during opening/closing switchgear operations are of increasing concern for the electric utility industry. These concerns include both power quality issues for voltage-sensitive customer loads, and excessive stresses on power system equipment. Some proposed solutions for reducing switching transients include circuit breaker pre-insertion devices, such as resistors or inductors, and fixed devices such as arresters and current limiting reactors.

A solution finding increasing popularity is the so-called synchronous switching method, sometimes also referred to as the point-on-wave switching. Synchronous switching is performed by dedicated electronic devices, indicated in the art as synchronous switching devices, which control the operations of the associated switchgear. Upon receiving a close or a trip command, a synchronous switching device delays the energization of the circuit breaker control coils by a few milliseconds. In this way, the current inception in the case of a close command, or the contact separation in the case of an opening or trip command, is expected to coincide with or be in a narrow window around a certain point on the AC wave which is known to reduce switching transients. For synchronous closing, this point is often the voltage zero crossing. Applications where it is beneficial to close the contacts on or near the voltage zero crossing include the energizing of capacitor banks and energizing of unloaded lines or cables. For opening synchronous switching operations, the targeted point-on-wave is a point on the current wave chosen to minimize the probability of unwanted restrikes or reignitions, for instance two milliseconds after a zero crossing. Synchronous opening can be employed for shunt reactors de-energizing as an example.

Two conditions must be met to successfully employ the concept of synchronous switching. First, the targets or points-on-wave that will result in the desired reduction of switching transients must be identified. Second, a method must be used to ensure that current inception (or contact separation) for each phase occurs as close as possible to the selected targets. This latter involves algorithms for the prediction of the future course of waveforms, as well as algorithms for the calculation of exact switchgear operating times for each pole based on past operations and/or external parameters, such as temperature, control voltage, hydraulic pressure etc.

The identification of the targets or points-on-wave that will result in the desired reduction of the switching transients is traditionally performed a-priori using system studies or general knowledge of the equipment being energized (or de-energized), such as capacitor banks, transformers, transmission lines, shunt reactors etc. These targets are programmed into the synchronous switching device and usually remain unchanged as long as the synchronous switching device is used for the same application. Some implementations of synchronous switching adapt the target for synchronous closing depending on dielectric properties, in particular the rate of decrease of dielectric strength (RDDS), of the circuit breaker.

However, in spite of theoretical knowledge and system studies performed to identify the targets on the voltage (or current) AC waveform for each pole to close (or open) that will result in the desired reduction of switching transients, some switching transients may still occur due to deviations of the theoretical behavior of the system from its practical behavior.

Hence, there is a potential to further reduce the severity of switching transients or even completely eliminate them and it would be desirable to provide a solution which allows to further optimize the selection of the targets on the AC waveform. This solution is provided by the method and apparatus of the present invention.

SUMMARY OF THE INVENTION

In accordance with the present invention, there is provided a method for optimizing switching operations executed by a switching device operatively coupled to an AC power line, the method comprising:

a) acquiring signals related to the waveform of the electrical phases of said AC power line;

b) when a command for executing a switching operation on at least one of said electrical phases is issued, storing signals acquired for said at least one of said electrical phases for a predetermined period of time;

c) calculating first data indicative of the time occurred for the executed switching operation;

d) based on the signals stored, calculating second data indicative of the severity of switching transients occurred during the executed switching operation;

e) based on at least said first and second data calculated for the executed switching operation, determining if a predefined parameter representative of a target point on the waveform for executing future switching operations substantially synchronous with said waveform has to be adjusted.

Further, the present invention provides an electronic device suitable for controlling switching operations executed by an associated switching device devised to be coupled to an AC power line, comprising:

a processor;

one or more storing units for storing signals;

software program instructions which are stored in one or more of said storing units and when executed by the processor cause the electronic device to perform a method comprising:

a) acquiring signals related to the waveform of the electrical phases of said AC power line;

b) when a command for executing a switching operation on at least one of said electrical phases is issued, storing signals acquired for said at least one of said electrical phases for a predetermined period of time;

c) calculating first data indicative of the time occurred for the executed switching operation;

d) based on the signals stored, calculating second data indicative of the severity of switching transients occurred during the executed switching operation;

e) based on at least said first and second data calculated for the executed switching operation, determining if a predefined parameter representative of a target point on the waveform for executing future switching operations substantially synchronous with said waveform has to be adjusted.

The present invention also provides a power system comprising:

a high voltage switchgear operatively connected to an AC power line, said high-voltage switchgear comprising two associated contacts which can be switched between a first position where they are coupled and a second position where they are separated;

an electronic device which is operatively coupled to said high-voltage switchgear for causing switching of said contacts between said first and second positions substantially synchronously with said power line, wherein said electronic device comprises:

a processor one or more storing units for storing signals;

software program instructions which are stored in one or more of said storing units and when executed by the processor cause the electronic device to perform a method comprising:

a) acquiring signals related to the waveform of the electrical phases of said AC power line;

b) when a command for executing a switching operation on at least one of said electrical phases is issued, storing signals acquired for said at least one of said electrical phases for a predetermined period of time;

c) calculating first data indicative of the time occurred for the executed switching operation;

d) based on the signals stored, calculating second data indicative of the severity of switching transients occurred during the executed switching operation;

e) based on at least said first and second data calculated for the executed switching operation, determining if a predefined parameter representative of a target point on the waveform for executing future switching operations substantially synchronous with said waveform has to be adjusted.

Finally, the present invention provides a computer readable medium having computer instructions stored thereon for execution by a microprocessor of an electronic device operatively coupled to a switching device to perform a method comprising:

a) acquiring signals related to the waveform of the electrical phases of an AC power line coupled to said switching device;

b) when a command for executing a switching operation on at least one of said electrical phases is issued, storing signals acquired for said at least one of said electrical phases for a predetermined period of time;

c) calculating second data indicative of the time occurred for the executed switching operation;

d) based on the signals stored, calculating second data indicative of the severity of switching transients occurred during the executed switching operation;

e) based on at least said first and second data calculated for the executed switching operation, determining if a predefined parameter representative of a target point on the waveform for executing future switching operations substantially synchronous with said waveform has to be adjusted.

BRIEF DESCRIPTION OF THE DRAWINGS

The features, aspects, and advantages of the present invention will become better understood with regard to the following description, appended claims, and accompanying drawings where:

FIG. 2 shows a phase waveform captured for an executed switching operation and the transient signal extracted there from;

DETAILED DESCRIPTION OF ILLUSTRATIVE EMBODIMENTS

Figure 1:
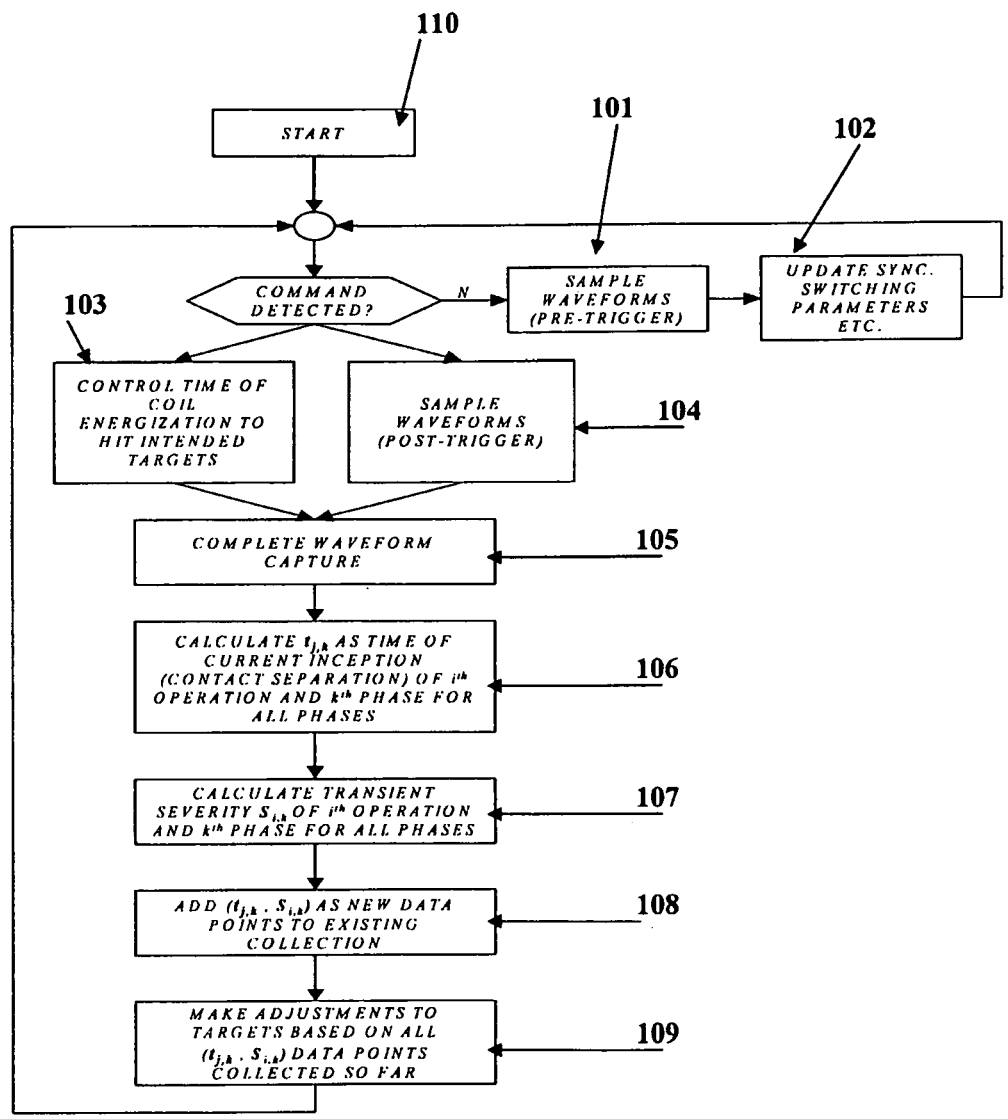
FIG. 1 is a flow chart illustrating a method for optimizing switching operations executed by a switching device operatively coupled to an AC power line in accordance to the present invention.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Figure 4:
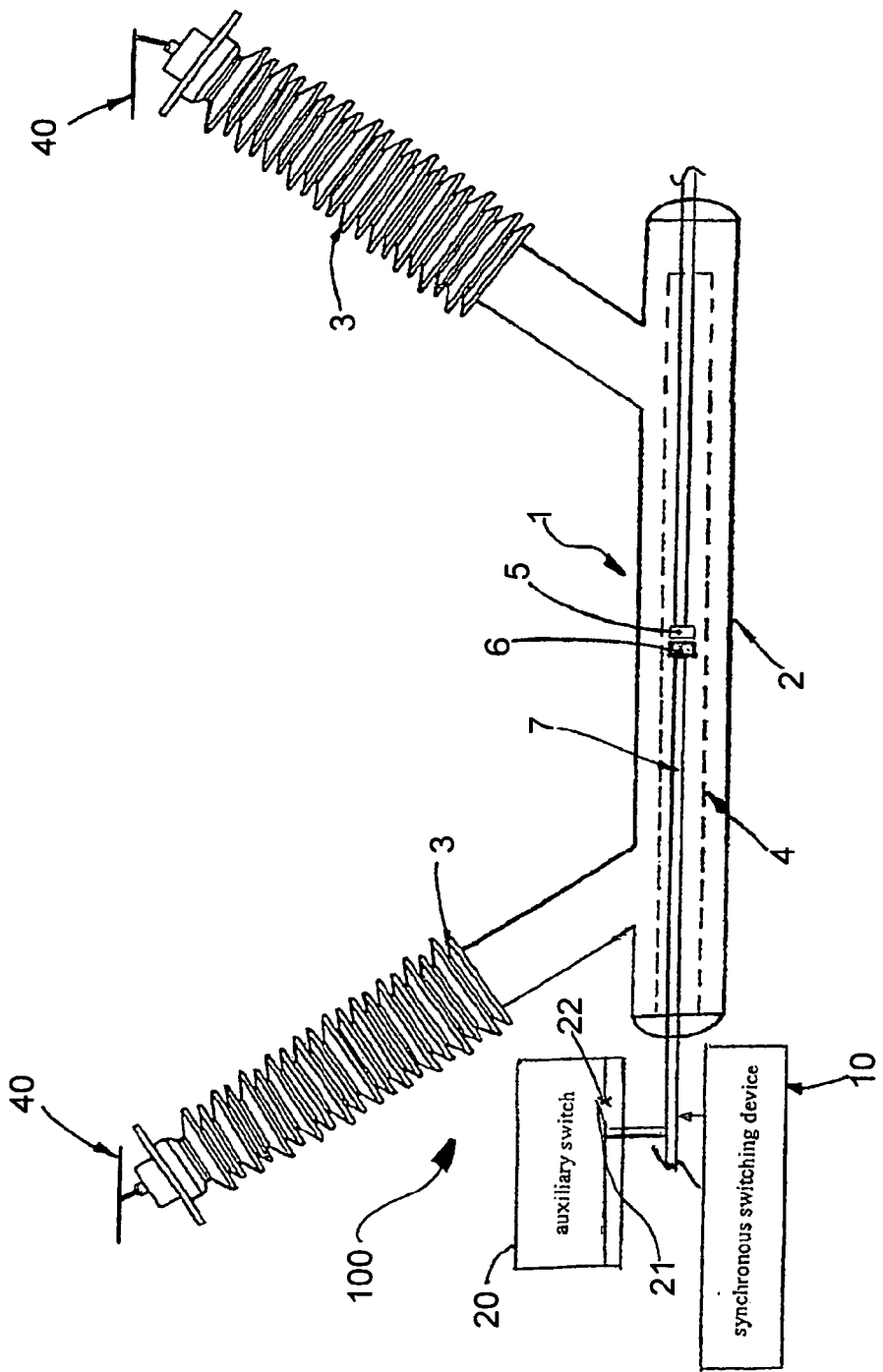
FIG. 4 schematically illustrates an exemplary embodiment of a power system according to the present invention.

FIG. 4 schematically illustrates an exemplary embodiment of a power system according to the present invention comprising a high-voltage apparatus indicated by the overall reference number 100. The apparatus 100 comprises a high-voltage switchgear 1 which is suitable to be operatively coupled to an associated AC power line 40, typically a three-phase AC power line. In the exemplary embodiment of FIG. 4 there is illustrated only one pole of the switchgear 1 which is coupled to a corresponding phase of the power line 40. It is to be understood that the present description will likewise apply to each phase of the power line 40 coupled to a corresponding pole of the switchgear 1.

The switchgear 1 comprises a casing 2 which is connected to two bushings 3 each housing an electrical terminal for input/output connections with the corresponding phase of the power line 40. Inside the casing 2 there is positioned a circuit breaker (or interrupter) 4 which comprises a pair of separable arcing contacts. The arcing contacts comprise usually a first fixed contact 5 and a movable contact 6. In some types of switchgear also the first contact 5 can be movable.

As is well known, during switching operations of the switchgear 1, i.e. opening/closing maneuvers, the movable contact 6 is moved by suitable actuating means which comprise for example a trip element, such as an energizing coil (not shown) and an actuating rod 7. Accordingly, the arcing contacts 5-6 are switched between a first position where they are coupled to each other and a second position where they are separated from each other. Those skilled in the art would appreciate that other types of high-voltage switchgear other than that illustrated in FIG. 4 can be suitably used.

Figure 5:
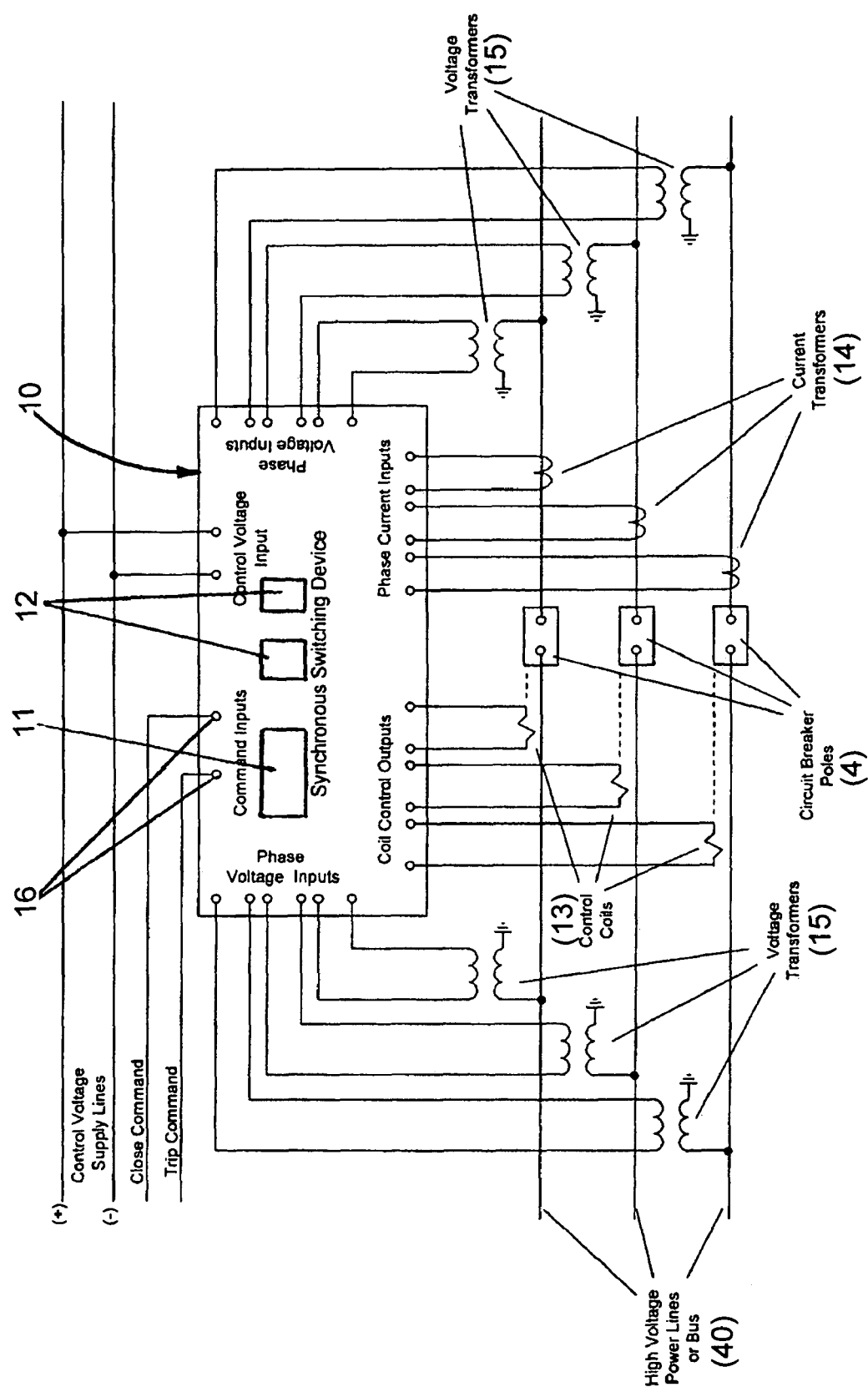
FIG. 5 is a schematic representation of an intelligent electronic device in accordance to the invention coupled to an associated circuit breaker used in a high-voltage three-phase power line.

An electronic device 10, preferably a synchronous switching device, is operatively coupled to each pole of the switchgear 1, and in particular of the corresponding circuit breaker 4. Typically, a synchronous switching device 10 is an intelligent electronic device (IED) which comprises, as is shown in FIG. 5, a processor 11, one or more storing units 12, such as buffers and other storing memories, e.g. random access memories (RAM) or Flash memories and software program instructions stored therein. These software program instructions are adapted to allow outputting command signals to the actuating means so that switching of the arcing contacts 5-6 between the first position and the second position are realized substantially synchronously with the waveform of the associated power line phase. In addition, in accordance with the present invention, the synchronous switching device 10 comprises dedicated software program instructions which are stored in one or more of the storing units 12 and can be executed by the processor 11 for the scope which will described in more details hereinafter.

Further, as illustrated in FIG. 5, the synchronous switching device 10 has means, e.g. field effect transistors (FETs), to control at least three control coils 13 each coupled to a respective circuit breaker 4 with independent pole operation. In addition, the device 10 is operatively associated with first means, e.g. current transformers 14, to sense at least one but preferably all three phase currents of the power line 40, and second means, e.g. voltage transformers 15, to sense at least one phase voltage. Preferably, six voltage transformers 15 are provided for sensing the voltage of all three phases on both sides of each circuit breaker 4. The device 10 also comprises one or more inputs 16 to detect a close or trip command.

An example of a suitable synchronous switching device 10 is the ABB Switching Control Sentinel (SCS), or the ABB Synchronous Control Unit (SCU). However, it would be appreciated by those skilled in the art that any other IED available on the market suitable for executing synchronous switching operations can be used.

As illustrated in FIG. 4, the apparatus 100 also comprises an auxiliary switch 20 having a pair of auxiliary contacts which are operatively connected to the arcing contacts 5-6. In particular, according to solutions well known in the art and therefore not described herein in detail, the auxiliary contacts comprise a fixed auxiliary contact 21 and a movable auxiliary contact 22 which is operatively connected to and actuated by the actuating means 7 that moves the movable arcing contact 6. In practice, when the synchronous switching device 10 outputs for instance an opening command for the circuit breaker 4, the movement of the arcing contact 6 results also in moving the auxiliary contact 22 so that it separates from the fixed auxiliary contact 21. An example of a suitable auxiliary switch 20 is the auxiliary switch Ruhrtal GPFX730166P001.

As illustrated in FIG. 1, when the equipment is in service under normal operating conditions, i.e. no commands for opening/closing are detected, the device 10 acquires and samples (step 101) signals related to the waveform of the electrical phases of the AC power line 40. In particular, the device 10 comprises one or more acquisition buffers 12 that can hold a certain numbers of samples. One of the acquisition buffers is always selected for continuous storage of samples. When the end of this acquisition buffer is reached, the first stored sample is overwritten and so on with new signals acquired. In this way, the samples acquired are temporarily stored for a first limited interval of time. In this condition, the device 10 keeps parameters that are needed for synchronous switching up-to-date and performs other typical IED functions (step 102) such as servicing the communication ports, etc.

When a close (or trip) command for executing a switching operation on at least one of the electrical phases is detected by the device 10, the device 10 at step 103 individually energizes the control coil 13 of the circuit breaker 4 associated with the phase subjected to the switching operation. The coil 13 is energized at such point in time that, under consideration of the individual circuit breaker predetermined operating time, the current inception (or contact separation) will substantially coincide with a predefined target or point on the phase waveform. Such targets or points-on wave are predefined target points on the waveform of the phase so that an ongoing switching operation is executed substantially synchronous with the waveform itself.

Further, the processor 11 of the device 10 continues to sample (step 104) the signals acquired for the waveform of the phase subject to the switching operation for a predetermined period of time; the sampled signals are stored (step 105) in one or more of the buffers 12. The processor 11 stores those sampled signals which are acquired from a predefined first instant before the opening or closing command is issued and up to a predefined second instant after the opening or closing command is issued. In particular, when a trip or close command is issued, the sample rate of the acquired signals is increased, for example from 2 kSamples/second of the normal sampling rate to 5 kSamples/second, for a certain period of time, e.g. 120 ms. The samples acquired at the higher sampling rate overwrite an equivalent number of samples acquired previously at a lower rate. At the end of the higher speed sampling period, the acquisition buffer contains a certain number of low speed samples covering a period before and up to the instant when the command is issued, for example by a control cabinet, and detected by the device 10, e.g. 50 ms, and a certain number of high speed samples covering an interval of time after the command is issued and detected, e.g. 120 ms. Further, at step 105 the processor can still store the waveforms for the other phases of the AC power lines not subject to the switching operation in case this data may be of interest for a customer Before the processor 11 returns to sampling continuously with the lower sampling rate, to prevent the acquisition buffer used that now contains a record of the last operation from being overwritten, the firmware switches to the next acquisition buffer. In this way, the synchronous switching device 10 ensures that waveform samples that have been acquired immediately before, during and after the time of command and breaker operation are not overwritten but instead saved. The captured waveforms can be also available to the end-user for data download. Preferably, the sampled signals of the captured waveform are permanently stored for a predetermined number of future switching operations of the same type, i.e. opening or closing, following the executed switching operation. For example, signals related to twenty more operations for each of which the above described steps are likewise performed can be stored. Hence, in this condition, samples are stored for a period of time longer than the above indicated first limited interval of time during which the samples acquired under normal operating conditions are stored. Once the size of the memory allocated for storing the samples related to switching operations of the same type is exhausted, samples related to a new operation will overwrite some samples previously stored. For example, samples related to the oldest recorded operation can be overwritten or replacement will be decided based on where data is needed. For instance, if there are more data points recorded in the vicinity of a certain target, e.g. 1 ms, but no points are available for other zones, e.g. between 2 ms and 3 ms, the processor will overwrite one of the data points in the 1 ms vicinity or replace it with an average.

At step 106 the processor 11 calculates first data indicative of the time occurred for the executed switching operation. The first data can be calculated either on the basis of the signals stored or independently there from. In particular, for a trip or opening command, the processor 11 calculates as the first data the time of arcing contacts 5-6 separation, while for a close command it calculates as the first data the time of current inception. The "time of current inception" is hereby meant as the time calculated by the processor 11 from a voltage zero crossing of the phase waveform to the time the absolute value of the current measured passes through a predefined threshold, e.g. 160 A, wherein the mentioned voltage zero crossing is the one closest to but preceding the current inception.

The time of arcing contacts separation is hereby meant as the time from the occurrence of a current zero crossing closest to but preceding arcing contacts separation to the occurrence of arcing contacts separation.

In particular, the arcing contacts separation can be calculated by the processor 11 as follows. During a commissioning or test phase of the equipment, one of the settings of the switching device 10 is previously assigned with a representative value indicative of a predefined operating condition, i.e. a test condition. For example, a user can set the nominal voltage setting equal to zero. In this way, the user indicates to the device 10 that operations are performed using low-voltage and low-current. "Low-voltage" as used herein means operations with nominal voltage below 1 kV. Then, a separation of the arcing contacts 5 and 6 is executed under the predefined operating condition, i.e. the arcing contacts 5-6 are separated under a low voltage condition. The executed predefined operating condition can be for example the so-called light bulb test which, as well known, is a typical part of the commissioning phase of a high-voltage switchgear, in particular a high-voltage circuit breaker controlled by a switching electronic device. While performing a light bulb test, the interrupter (or circuit breaker) 4 is used to switch standard light bulbs (ratings around 120V, 100 W) in order to create AC signals that can be fed into the synchronous switching device 10 for test purposes. The synchronous switching device 10 can extract the time of current interruption from this signal when the circuit breaker operates. The separation of the arcing contacts 5-6 is clearly marked by the interruption of current. Hence, since the time of current interruption does coincide with the separation time of the arcing contacts 5-6, the time of current interruption is measured for the occurred arcing contacts separation. The measured time of current interruption is assigned equal to the separation time of the arcing contacts 5-6. "Separation time of the arcing contacts" as used herein means the time interval lapsing from the time the synchronous switching device 10 outputs a command signal to the actuating means, e.g. to a trip unit such as an energizing coil, up to when the movable arcing contact 6 is not any more in mechanical contact with the fixed arcing contact 5.

As above indicated, the separation of the arcing contacts causes also the separation of the auxiliary contacts 21-22, and the time of this separation is also measured by the processor 11. "Separation time of the auxiliary contacts 21-22" as used herein means the time interval lapsing from the time the synchronous switching device 10 outputs a command signal to the actuating means, e.g. a trip unit such as an energizing coil, up to when the movable auxiliary contact 22 is not any more in mechanical contact with the fixed auxiliary contact 21.

The processor 11 then calculates the time delay between the measured separation time of the arcing contacts 5-6 and the measured separation time of the auxiliary contacts 21-22 for the executed predefined operating condition (test condition). After the predefined test condition is performed, the setting previously assigned with the value indicative of the predefined operating condition, e.g. as stated above the assigned nominal voltage equal to zero, can be changed to a different value.

When the command for executing a switching operation other than a test operation is issued for one or more phases of the power line, the switchgear 1 opens and the arcing contacts 5-6 separate. The processor 11 first measures the separation time of the auxiliary contacts 21-22 for the occurred operating condition other than the predefined operating condition, and then calculates the separation time of the arcing contacts 5-6 as the difference between the separation time of the auxiliary contacts measured during the operating condition other than the predefined operating condition and the previously calculated time delay.

At step 107, the processor 11 calculates, based on the signals stored, second data indicative of the severity of switching transients occurred during the executed switching operation. It would be appreciated by a person skilled in the art that steps 106-107 can be executed in whatever order with respect to each other.

Figure 2:
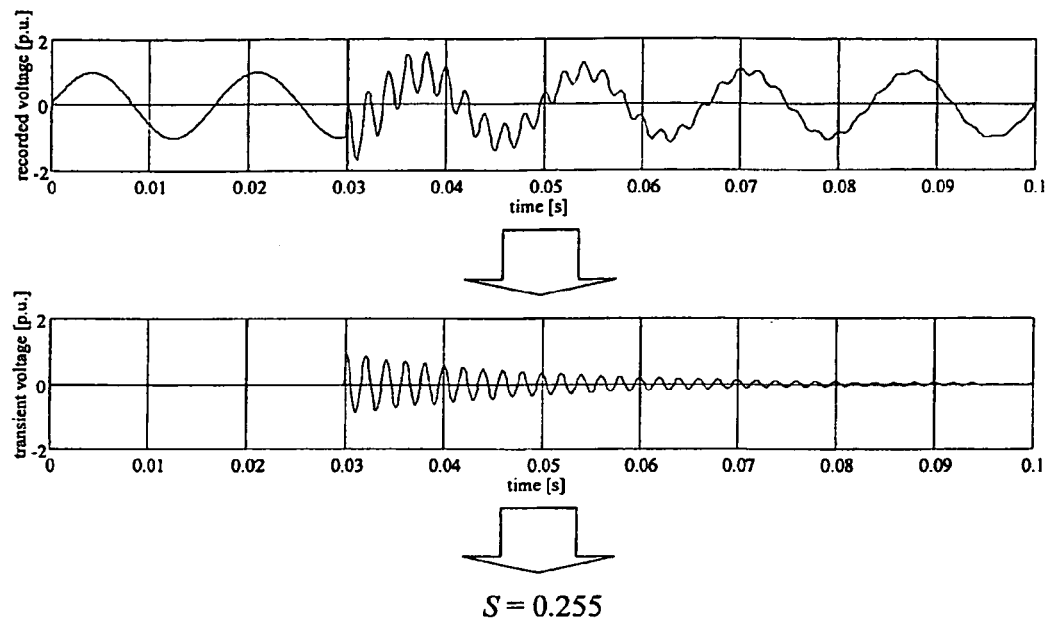

In particular, at step 107 the processor 11 extracts, from the stored signals, signals representative of the switching transients occurred during the executed operation. More in detail, the processor 11 subtracts signals representative of the steady state of the phase waveform from the stored signals, thus obtaining signals representing the transient signal, as for example illustrated in FIG. 2 for the voltage signals recorded during the executed operation, and the transient voltage extracted there from.

In particular, to obtain a single number describing the severity of a switching transient, a root-mean-square calculation is performed:

$$S = \sqrt{\frac{1}{T}\int_T (x - x_{steady\_state})^2 \cdot dt} \approx \sqrt{\frac{1}{N}\sum_{k=1}^{N}(x_k - x_{k,steady\_state})^2}$$

where S is the severity of the transient, x is the recorded waveform (voltage or current); $x_{steady\_state}$ is the steady state signal contained in the waveform and extrapolated until the end of waveform capture time period; T is the time from the breaker operation until the end of the waveform capture; N is the number of samples acquired during this time; and k is the index of the $k^{th}$ sample.

An alternative method is to use the peak value of the transient signal as a measure for the severity of a transient:

$$S_{alt} = \max_{k=1}^{N}|x_k - x_{k,steady\_state}|$$

where $S_{alt}$ is the severity of the transient; max denotes the maximum value from the specified set of samples. The other variables have the same meaning as defined above.

At step 108, the processor 11 adds the first data and the second data calculated to the existing collection of first and second data, if any. In particular, also first and second data for each executed switching operation can be permanently stored in one or more of the storing unit 12 for a desired predetermined number of future switching operations of the same type following the executed switching operation. In this way a collection of available data is built up. Then, as previously described, once the size of the memory allocated for storing the first and second data related to switching operations of the same type is exhausted, data related to a new operation will overwrite some data previously stored. For example, data related to the oldest recorded operation can be overwritten or replacement will be decided based on where data is needed.

Figure 3:
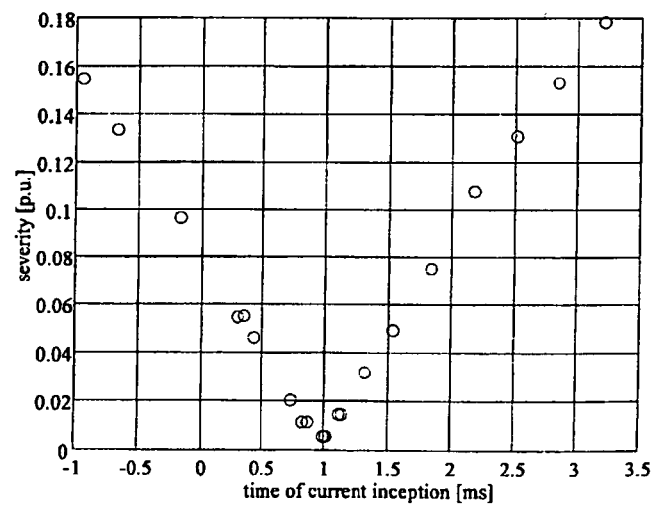
FIG. 3 is a graph schematically representing the correlation between calculated data relative to the transient occurred during an executed switching operation.

FIG. 3 shows an example of the correlations of the transient severities vs. times of current inception plotted for a single phase and for several switching operations. In this particular example, the optimized target is around 1.0 ms referenced from a voltage zero crossing. The example given in FIG. 3 relates to a synchronous closing operation and voltage transients but the same applies also to both synchronous closing and opening with evaluation of current transients and/or voltage transients.

At step 109, based on at least the first and second data calculated for the last executed switching operation, the processor 11 determines if a pre-defined parameter has to be adjusted.

This predefined parameter, constituted in practice by a measure of time, is representative of and related to a target point on the waveform of the phase for executing future switching operations substantially synchronous with the waveform itself. An opening or closing operation is considered substantially synchronous if it is ideally completed exactly on the predefined target point on the waveform or in any case within a narrow window around it. In particular, when the system is put into service, the initial parameter is defined in a start step 110 wherein a few switching operations are executed in order to set-up the first initial target and quantify a related severity of switching transients which will be used as starting terms of comparison for the following operations. Hence, the processor 11 compares the data calculated for the last operation with the previously defined parameter, and decides whether to keep the parameter equal to the one previously defined or to adjust it on the basis of the newly calculated parameters. In the latter case, the new adjusted parameter becomes the predefined parameter for the next switching operation of the same type. In this way the synchronous switching device 10 performs synchronous switching operations in a better way, resulting in a further reduction or even complete elimination of switching transients.

When a command for executing a switching operation is issued for more than one of the electrical phases, e.g. for all three phases of the power line 40, samples are captured and stored at steps 104-105 for the waveform of each phase as previously described. Further, the first data and the second data are also calculated at steps 106 and 107, respectively, for each phase. Then, based on at least the first and second data calculated for the executed switching operation on each phase, the processor 11 determines, if the respective pre-defined parameter has to be adjusted. If this is the case, it proceeds and adjusts the predefined parameter for each electrical phase for which a command for executing a switching operation was issued.

In particular, depending on the applications, the processor 11 can adjust the predefined parameter for each electrical phase by assigning to this parameter a value whose amount is equal for all the electrical phases or the processor 11 can adjust the predefined parameter of each phase independently from the other phases. For instance, if a synchronous closing operation is executed for a grounded capacitor bank, it can be assumed that the relationship between time of current inception and severity of transients is substantially the same for all phases and hence the parameter can be adjusted by the same amount for all phases.

Further, if desired, the processor 11 can be programmed to decide whether to adjust or not the previously defined parameter for each phase based not only on the data calculated for the last executed operation but also on data calculated for previously executed operations of the same type for the same phase. Also the processor 11 could be also programmed to use data calculated for the same type of operation on the other phases. Whether or not to treat all phases combined or separately could be controlled by a user setting.

As will be appreciated by one of ordinary skill in the art, the present invention may be embodied as or take the form of the method and system previously described, an electronic device as well as of a computer readable medium having computer-readable instructions stored thereon which, when executed by a processor, carry out the operations of the present invention as previously described and defined in the corresponding appended claims. In particular, the computer-readable medium may be any medium that can contain, store, communicate, propagate, or transport the user-interface program instruction for use by or in connection with the instruction execution system, apparatus, or device and may by way of example but without limitation, be an electronic, magnetic, optical, electromagnetic, infrared, or semiconductor system, apparatus, device, or propagation medium or other suitable medium upon which the program is printed. More specific examples (a non-exhaustive list) of the computer-readable medium would include: a portable computer diskette, a hard disk, an electronic memory, a portable compact disc (CD), an optical storage device, a transmission media such as those supporting the Internet or an intranet, or a magnetic storage device. Computer program code or instructions for carrying out operations of the present invention may be written in any suitable programming language provided it allows achieving the previously described technical results.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for optimizing switching operations executed by a switching device operatively coupled to an AC power line, the method comprising:
   a) acquiring signals related to the waveform of the electrical phases of said AC power line;
   b) when a command for executing a switching operation on at least one of said electrical phases is issued, storing signals acquired for said at least one of said electrical phases for a predetermined period of time;
   c) calculating first data indicative of the time occurred for the executed switching operation;
   d) calculating second data indicative of the severity of switching transients occurred during the executed switching operation, wherein said calculating second data comprises subtracting signals representative of the steady state waveform of the at least one electrical phase from the stored signals, resulting in transient signals of the at least one electrical phase;
   e) based on at least said first and second data calculated for the executed switching operation, determining if a pre-defined parameter representative of a target point on the waveform for executing future switching operations substantially synchronous with said waveform has to be adjusted.

2. The method of claim 1, wherein said step b) comprises increasing the sampling rate of the acquired signals from a first sampling rate to a second sampling rate for a predetermined period of time.

3. The method of claim 1, wherein said step b) comprises storing the signals related to the waveform of said at least one phase which are acquired from a predefined first instant before and up to a predefined second instant after said command is issued.

4. The method of claim 1, wherein said signals are stored for a predetermined number of future switching operations following said executed switching operation.

5. The method of claim 1, wherein step d) further comprises executing a root-mean-square calculation on said transient signals.

6. The method of claim 1, wherein step d) further comprises calculating the peak value of said transient signals.

7. The method of claim 1, further comprising: when a command for executing a switching operation on each of said electrical phases is issued, executing said steps b), c), d) and e) for each electrical phase.

8. The method of claim 2 wherein said second sampling rate is two or more times greater than said first sampling rate.

9. An electronic device suitable for controlling switching operations executed by an associated switching device devised to be coupled to an AC power line, comprising:
a processor;
one or more storing units for storing signals;
software program instructions which are stored in one or more of said storing units and when executed by the processor cause the electronic device to perform a method comprising:
a) acquiring signals related to the waveform of the electrical phases of said AC power line;
b) when a command for executing a switching operation on at least one of said electrical phases is issued, storing signals acquired for said at least one of said electrical phases for a predetermined period of time;
c) calculating first data indicative of the time occurred for the executed switching operation;
d) calculating second data indicative of the severity of switching transients occurred during the executed switching operation, wherein said calculating second data comprises subtracting signals representative of the steady state waveform of the at least one electrical phase from the stored signals, resulting in transient signals of the at least one electrical phase;
e) based on at least said first and second data calculated for the executed switching operation, determining if a predefined parameter representative of a target point on the waveform for executing future switching operations substantially synchronous with said waveform has to be adjusted.

10. The electronic device of claim 9, wherein said step b) comprises increasing the sampling rate of the acquired signals from a first sampling rate to a second sampling rate for a predetermined period of time.

11. The electronic device of claim 10 wherein said second sampling rate is two or more times greater than said first sampling rate.

12. The electronic device of claim 9, wherein the method further comprises storing the signals related to the waveform of said at least one phase which are acquired from a predefined first instant before and up to a predefined second instant after said command is issued.

13. The electronic device of claim 9, wherein said signals are stored for a predetermined number of future switching operations following said executed switching operation.

14. The electronic device of claim 9, wherein said method comprises: when a command for executing a switching operation on each of said electrical phases is issued, executing said steps b), c), d) and e) for each electrical phase.

15. The electronic device of claim 9, wherein step d) further comprises executing a root-mean-square calculation on said transient signals.

16. The electronic device of claim 15, wherein step d) further comprises calculating the peak value of said transient signals.

17. A power system comprising:
a high voltage switchgear operatively connected to an AC power line, said high-voltage switchgear comprising two associated contacts which can be switched between a first position where they are coupled and a second position where they are separated;
an electronic device which is operatively coupled to said high-voltage switchgear for causing switching of said contacts between said first and second positions substantially synchronously with said power line, wherein said electronic device comprises:
a processor;
one or more storing units for storing signals;
software program instructions which are stored in one or more of said storing units and when executed by the processor cause the electronic device to perform a method comprising:
a) acquiring signals related to the waveform of the electrical phases of said AC power line;
b) when a command for executing a switching operation on at least one of said electrical phases is issued, storing signals acquired for said at least one of said electrical phases for a predetermined period of time;
c) calculating first data indicative of the time occurred for the executed switching operation;
d) calculating second data indicative of the severity of switching transients occurred during the executed switching operation, wherein said calculating second data comprises subtracting signals representative of the steady state waveform of the at least one electrical phase from the stored signals, resulting in transient signals of the at least one electrical phase;
e) based on at least said first and second data calculated for the executed switching operation, determining if a predefined parameter representative of a target point on the waveform for executing future switching operations substantially synchronous with said waveform has to be adjusted.

18. The power system of claim 17, wherein said step b) comprises increasing the sampling rate of the acquired signals from a first sampling rate to a second sampling rate for a predetermined period of time.

19. The power system of claim 18 wherein said second sampling rate is two or more times greater than said first sampling rate.

20. The power system of claim 17, wherein the method further comprises storing the signals related to the waveform of said at least one phase which are acquired from a predefined first instant before and up to a predefined second instant after said command is issued.

21. The power system of claim 17, wherein said signals are stored for a predetermined number of future switching operations following said executed switching operation.

22. The power system of claim 17, wherein said method comprises: when a command for executing a switching operation on each of said electrical phases is issued, executing said steps b), c), d) and e) for each electrical phase.

23. The power system of claim 17, wherein step d) further comprises executing a root-mean-square calculation on said transient signals.

24. The power system of claim 23, wherein step d) further comprises calculating the peak value of said transient signals.

* * * * *